(12) United States Patent
Johnson

(10) Patent No.: US 6,417,675 B1
(45) Date of Patent: Jul. 9, 2002

(54) RECEIVER IMPEDANCE CALIBRATION ARRANGEMENTS IN FULL DUPLEX COMMUNICATION SYSTEMS

(75) Inventor: Luke A. Johnson, Tempe, AZ (US)

(73) Assignee: Intel Corporation, Santa Clara, CA (US)

(*) Notice: Subject to any disclaimer, the term of this patent is extended or adjusted under 35 U.S.C. 154(b) by 42 days.

(21) Appl. No.: 09/652,031

(22) Filed: Aug. 31, 2000

(51) Int. Cl.[7] ............................................... G01R 27/28
(52) U.S. Cl. ........................................ 324/601; 324/628
(58) Field of Search .............................. 324/628, 539, 324/620, 601, 629

(56) References Cited

U.S. PATENT DOCUMENTS

| | | | | |
|---|---|---|---|---|
| 5,084,637 A | * | 1/1992 | Gregor | 326/30 |
| 5,111,080 A | * | 5/1992 | Mizukami et al. | 326/30 |
| 5,463,359 A | * | 10/1995 | Heaton | 327/334 |
| 5,548,222 A | * | 8/1996 | Jensen et al. | 324/539 |
| 5,726,582 A | | 3/1998 | Hedberg | |
| 6,297,647 B2 | * | 10/2001 | Kirk et al. | 324/628 |

* cited by examiner

Primary Examiner—N. Le
Assistant Examiner—Vincent Q. Nguyen
(74) Attorney, Agent, or Firm—Antonelli, Terry, Stout & Kraus, LLP

(57) ABSTRACT

The present invention is directed to receiver impedance calibration arrangements in full duplex communication systems.

18 Claims, 5 Drawing Sheets

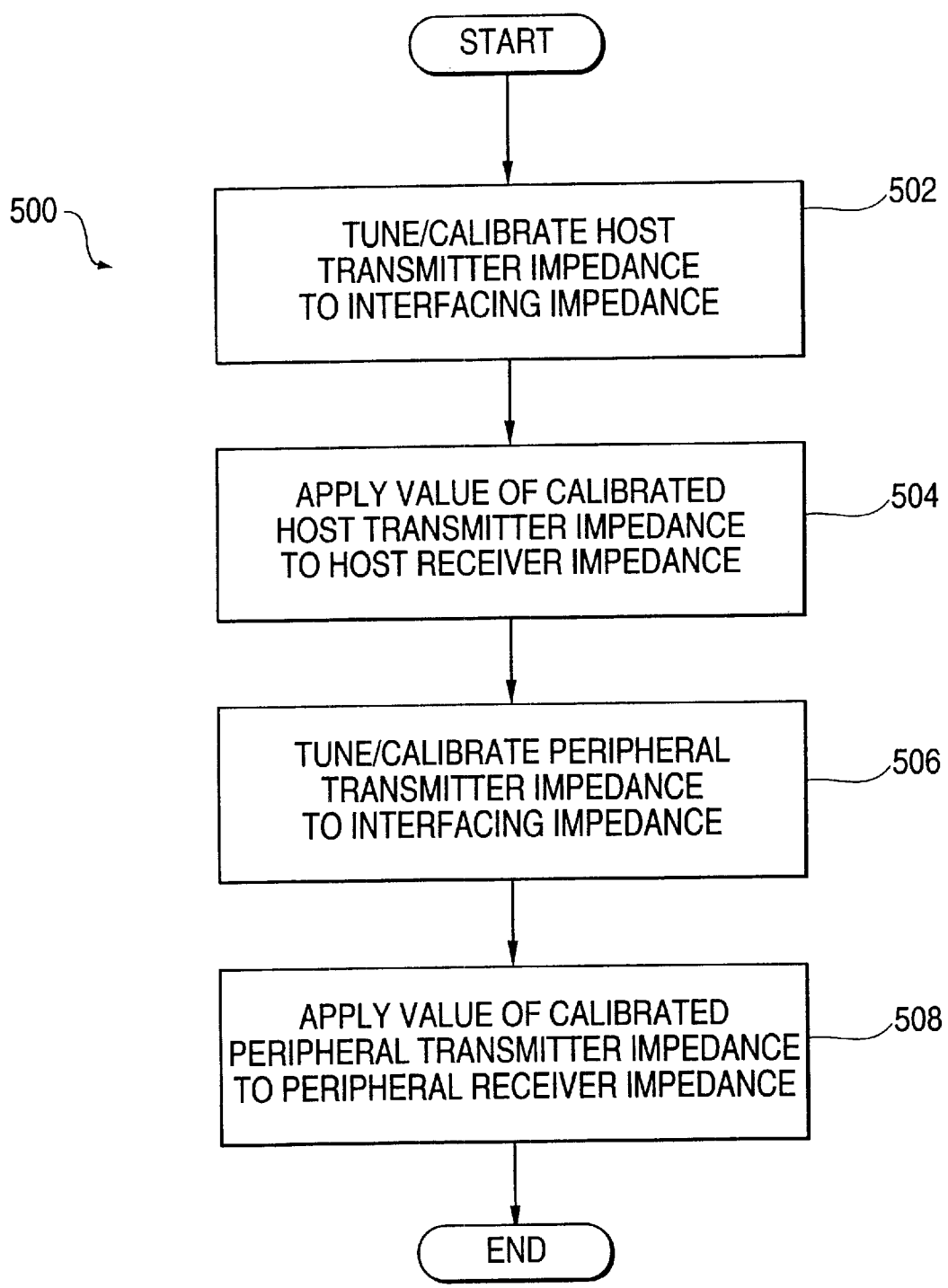

RECEIVER IMPEDANCE CALIBRATION ARRANGEMENTS IN FULL DUPLEX COMMUNICATION SYSTEMS

FIELD

The present invention is directed to receiver impedance calibration arrangements in full duplex communication systems.

BACKGROUND

Although this background and example embodiments of the present invention will be described using an example cabled or wired environment, practice of the invention is not limited thereto, i.e., the invention may be able to be practiced with other types of environments (e.g., on printed circuit (PC) boards, on-die).

To accomplish high-speed communication over a wire, it is important that both the transmitter and the receiver are impedance matched to the cable linking them. If such a match is not accomplished, some of the signal will be reflected back to the transmitter and again to the receiver at a later point in time where it will add error to the signal being sent. Manufacturing variation in both semiconductor circuit arrangements and a cable interconnecting the same, make calibration a necessary part of low-cost, high performance communications. Many techniques are available for providing the necessary calibration for a transmitter. They rely on sending a signal of some sort down the wire and looking at what is reflected back. This works wonderfully for transmitters, but is not easily implemented on a receiver. To implement such a function on a receiver, a transmitter may be added to the receiver inputs. This adds cost, complexity and capacitance to the receiver, all of which are non-desirable.

What is needed is a lower cost, simplistic, lower impedance arrangement to effect receiver impedance calibration.

BRIEF DESCRIPTION OF THE DRAWINGS

The foregoing and a better understanding of the present invention will become apparent from the following detailed description of example embodiments and the claims when read in connection with the accompanying drawings, all forming a part of the disclosure of this invention. While the foregoing and following written and illustrated disclosure focuses on disclosing example embodiments of the invention, it should be clearly understood that the same is by way of illustration and example only and the invention is not limited thereto. The spirit and scope of the present invention are limited only by the terms of the appended claims.

The following represents brief descriptions of the drawings, wherein:

FIG. 5 is a flowchart showing example operations with respect to the advantageous FIG. 4 example embodiment, for calibrating host and peripheral devices to interfacing impedances in the full duplex communication system.

DETAILED DESCRIPTION

Figure 1:
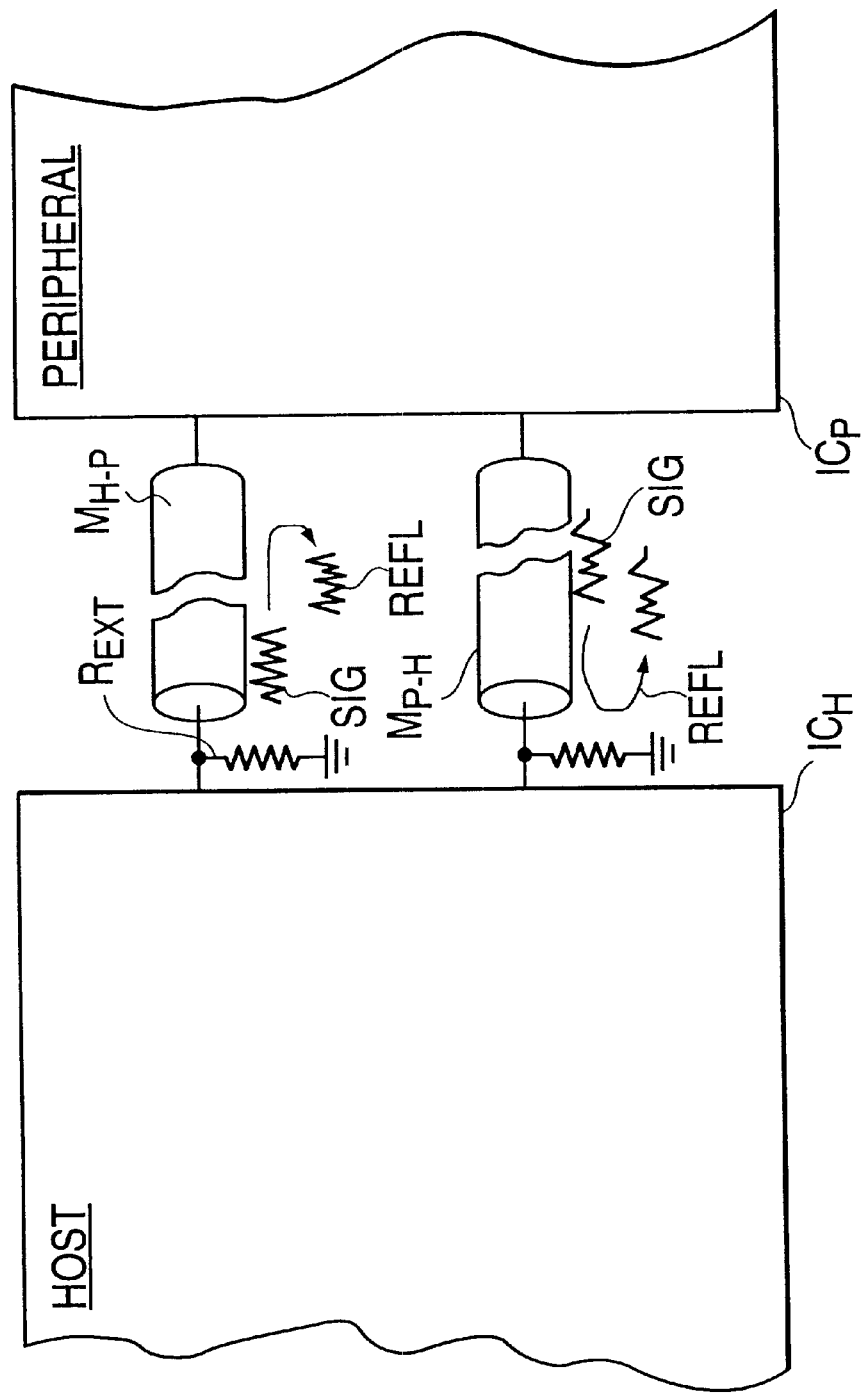
FIG. 1 is a partial block diagram of an example system useful in explanation/understanding of a disadvantageous impedance mis-matched system.

Before beginning a detailed description of the subject invention, mention of the following is in order. When appropriate, like reference numerals and characters may be used to designate identical, corresponding or similar components in differing figure drawings. Well known power/ground connections to ICs and other components may not be shown within the FIGS. for simplicity of illustration and discussion, and so as not to obscure the invention. Further, arrangements may be shown in block diagram or schematic form in order to avoid obscuring the invention, and also in view of the fact that specifics with respect to implementation is highly dependent upon the platform within which the present invention is to be implemented, i.e., specifics should be well within purview of one skilled in the art. Where specific details (e.g., circuits, flowcharts) are set forth in order to describe example embodiments of the invention, it should be apparent to one skilled in the art that the invention can be practiced without these specific details. Finally, it should be apparent that differing combinations of hard-wired circuitry and software can be used to implement embodiments of the present invention, i.e., the present invention is not limited to any specific combination of hardware and software.

As mentioned previously, in the world of electrical signal transmission, it is known that if a traveling signal experiences any discontinuity (e.g., change in impedance) along a transmission path, such signal can experience undesirous effects such as signal reflection. The world of full duplex communications between two wire-interconnected integrated circuits (ICs) will be used to illustrate such problem and example embodiments, although practice of the present invention is not limited to the same. More particularly, referencing FIG. 1 for background discussion, shown is a host integrated circuit (IC) labeled $IC_H$, a peripheral IC labeled $IC_P$, and duplex transmission mediums $M_{H\text{-}P}$, $M_{P\text{-}H}$ (e.g., coaxial cables), connected to input/output terminals and providing full duplex signal transmission paths therebetween. The host communicates with a receiver over a two differential pair signal wires to the peripheral. One pair is dedicated to transmission to the peripheral device from the host, and the other is dedicated to receiving from the peripheral to the host. While the transmission mediums $M_{H\text{-}P}$, $M_{P\text{-}H}$, are manufactured with a goal to have a predetermined characteristic impedance, e.g., 50 ohms ($\Omega$), in practice, providing an exact impedance is prohibitively/non-competitively expensive, and accordingly, some predetermined variation in impedance is tolerated in a trade-off for affordably priced items.

If a transmitter within $IC_H$ outputs a signal SIG from an input/output (I/O) terminal onto transmission medium $M_{H\text{-}P}$, such signal SIG will travel along transmission line $M_{H\text{-}P}$, and unless an I/O terminal of $IC_H$ is impedance matched to the characteristic impedance of the transmission mediums $M_{H\text{-}P}$, such traveling signal will experience an impedance discontinuity and will experience undesirous effects such as a signal reflection REFL. Such reflection REFL is undesirous because it lessens a signal strength of the signal SIG and/or represents noise. The signal SIG may also reflect back from $IC_P$ if $IC_P$ is not matched to the transmission line impedance, again lessening signal strength and/or representing noise. Reflectometry is used to watch reflection of a signal to tune impedance.

As one method to avoid substantial impedance mismatch, an impedance such as an external resistor $R_{EXT}$ (FIG. 1) may be provided at each I/O terminal so as to impedance match the I/O terminal to the transmission line. An impedance is illustrated only on the host side, for sake of clarity and brevity. With such impedance matching, little discontinuity and thus minimal reflections are experienced by a traveling signal at the end of the line. The problem with this approach is that typically a respective precision impedance (e.g., resistor) is needed for each I/O terminal, such precision impedances being relatively high in cost. Further, manufacturing costs, time and complexity are increased because the precision impedances must be connected to the respective I/O terminals. Still further, the external impedances take up valuable space (aka, real estate) on a printed circuit board (PCB), which is disadvantageous in the present trend of the computer industry to provide more and more dense and compacted apparatus (e.g., computers, servers, etc.).

While it would be nice to be able to provide precision resistors internally (i.e., on-die) within an IC, IC manufacturing processes vary substantially from manufacturing lot to manufacturing lot, and as a result of such manufacturing variations, IC components correspondingly vary making it very difficult and/or cost prohibitive to provide/guarantee such precision resistors. For example, a CMOS process may result in devices having characteristics which vary from −50% to +150% of goal characteristics. Further, even if such precision resistors could be provided on-die, such approach would still be disadvantageous in that use of precision resistors is a static technique which would not allow for adjustment at the time of IC installation to varying transmission medium impedances, and which would not allow for continuous process, voltage and temperature compensations. That is, voltage and temperature environments, for example, within an IC and/or on signal transmission paths change over time during the operation of an apparatus, and accordingly, any matching arrangement should have the ability to be continuously "adaptive" to such changes over time.

Figure 2:
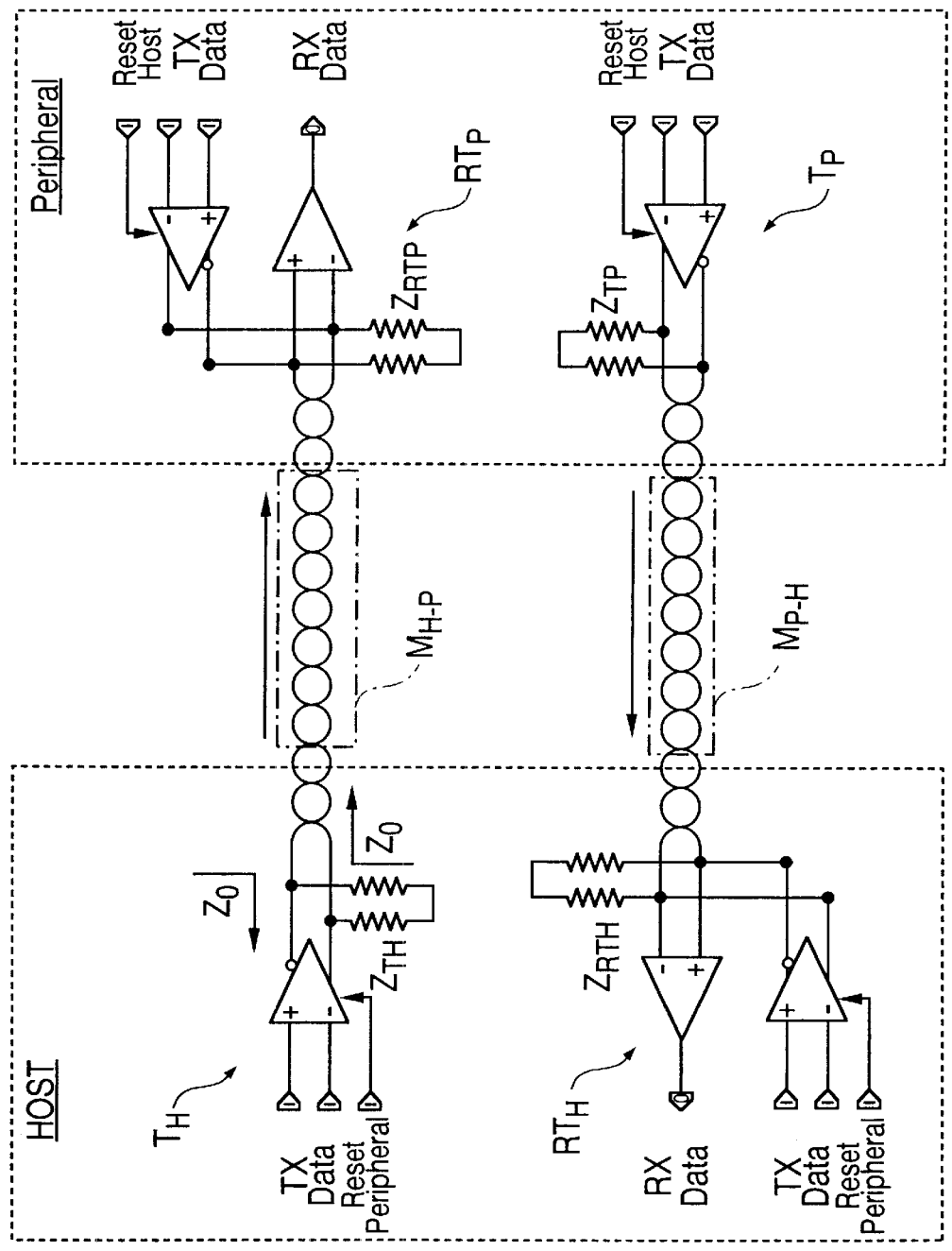
FIG. 2 is a block/schematic diagram of an example embodiment having a disadvantageous arrangement for calibrating host and peripheral devices to interfacing impedances in a full duplex communication system.

A trend in the industry is provide impedance matching arrangements "on-die". More particularly, referencing FIG. 2, shown is the host, peripheral and transmission mediums $M_{H-P}$, $M_{P-H}$, with internal portions of the host and peripheral shown in greater detail. More specifically, further illustrated are a host transmitter $T_H$, host receiver/transmitter $RT_H$, a peripheral transmitter $T_P$, and a peripheral receiver/transmitter $RT_P$. Typical inputs and outputs are shown associated with the various transmitters and receivers, but specifics concerning such inputs and outputs are well known within the art and thus are not discussed in detail for sake of brevity. Shown associated with the host transmitter $T_H$ is a host transmitter calibration impedance $Z_{TH}$, and a host receiver/transmitter calibration impedance $Z_{RTH}$ is shown associated with the host receiver/transmitter $RT_H$. Similarly, calibration impedances $Z_{TP}$ and $Z_{RTP}$ are illustrated within the peripheral. More particularly, as one non-limited example, the FIG. 2 (and FIG. 4) arrangement can represent a configuration where the host represents a motherboard, where the peripheral represents a hard drive, and where the transmission medium (e.g., a cable) allows a serial transmission of data/instructions between the motherboard and the hard drive according to a serial ATA protocol.

Figure 3:
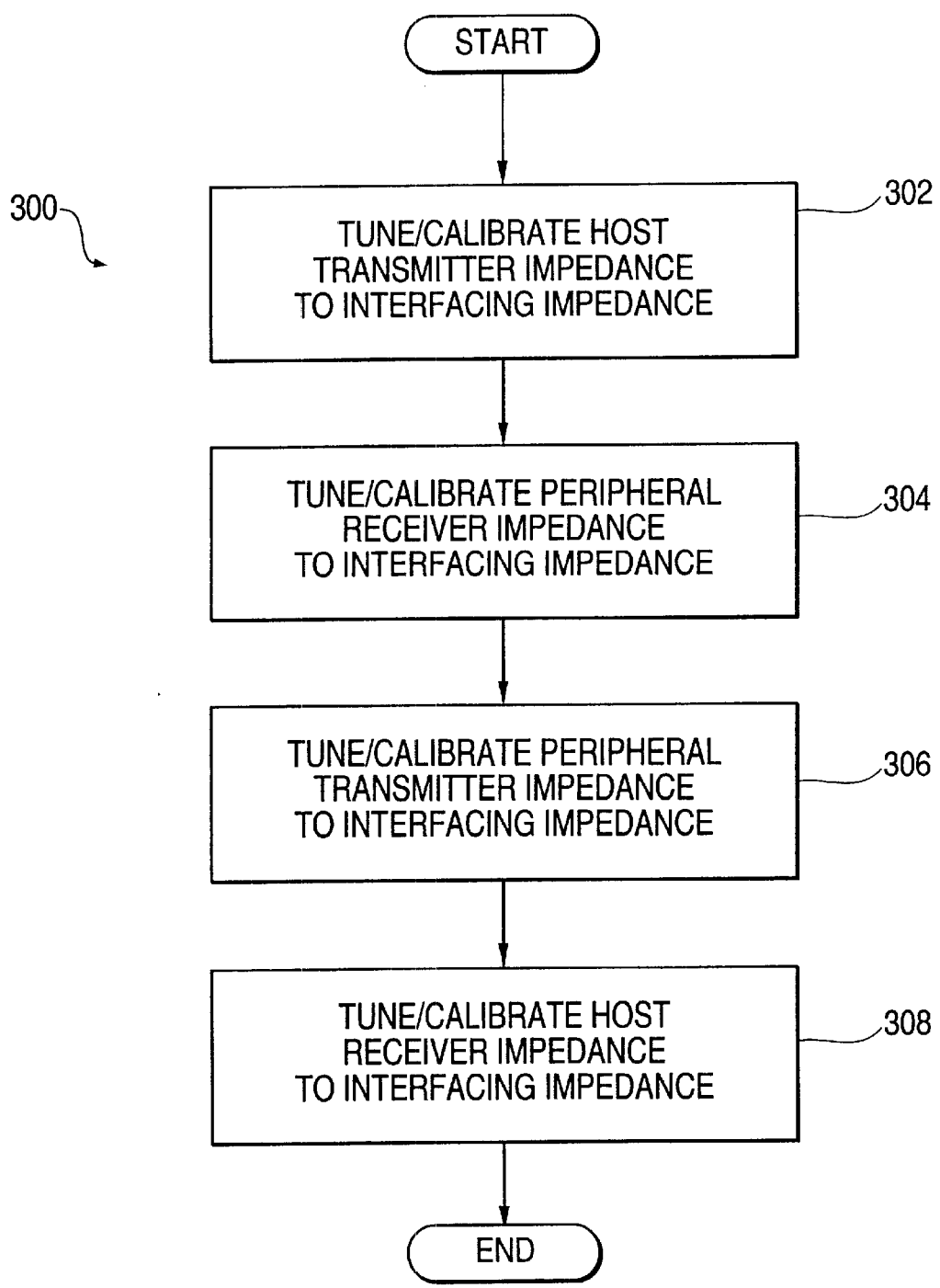
FIG. 3 is a flowchart showing example operations with respect to the disadvantageous FIG. 2 example embodiment, for calibrating host and peripheral devices to interfacing impedances in the full duplex communication system.

FIG. 3 is an example flow chart showing example operations with respect to the disadvantageous FIG. 2 example embodiment, i.e., for calibrating host and peripheral devices to interfacing impedances in the full duplex communication system. Numerous methods of reflectometry are known in the art and numerous methods of calibrating the calibration impedances of transistors and receivers are likewise known in the art, and accordingly, specifics of such methods are not discussed for the sake of brevity, but all such methods being applicable to the FIG. 2 arrangement as well as to practice of the present invention.

Turning now to further detailed discussion of FIG. 3, shown is an example flow chart 300. After a "start", at a block 302, a tuning or calibration of the host transmitter impedance $Z_{TH}$ to the interfacing impedance (i.e., the impedance of the transmission medium $M_{H-P}$, in this example) is performed. At a block 304, a tuning or calibration of the peripheral receiver impedance $Z_{RTP}$ to the interfacing impedance (again the impedance of the transmission medium $M_{H-P}$) is performed. Similarly, in blocks 306 and 308, there is a tuning or calibration of the peripheral transmitter impedance $Z_{TP}$ and the host receiver impedance $Z_{RTH}$ to the interfacing impedance (i.e., the impedance of transmission medium $M_{P-H}$).

The FIG. 2 embodiment is disadvantageous in a number of regards. Most importantly, the extraneous transmitters associated with the receivers in each of the host and peripheral adds cost, complexity and additional impedance (e.g., capacitance) to the receiver, all of which are undesirable. More particularly, such extraneous transmitters are provided for the sole purpose of tuning/calibrating the associated receiver, i.e., such transmitters are used to send out and reflect a signal from the interfacing impedance to calibrate the receiver's impedance. After impedance calibration, the transmitters associated with the receivers are disabled. Accordingly, there is only a small amount of usage, and thus the transmitters associated with the receivers represent inefficient use of on-die real estate and add unnecessary cost and complexity. Further, such transmitter disadvantageously have impedances associated therewith which may disadvantageously affect tuning/calibration, as such reactive component has varying effects on the circuit as a frequency is varied.

Figure 4:
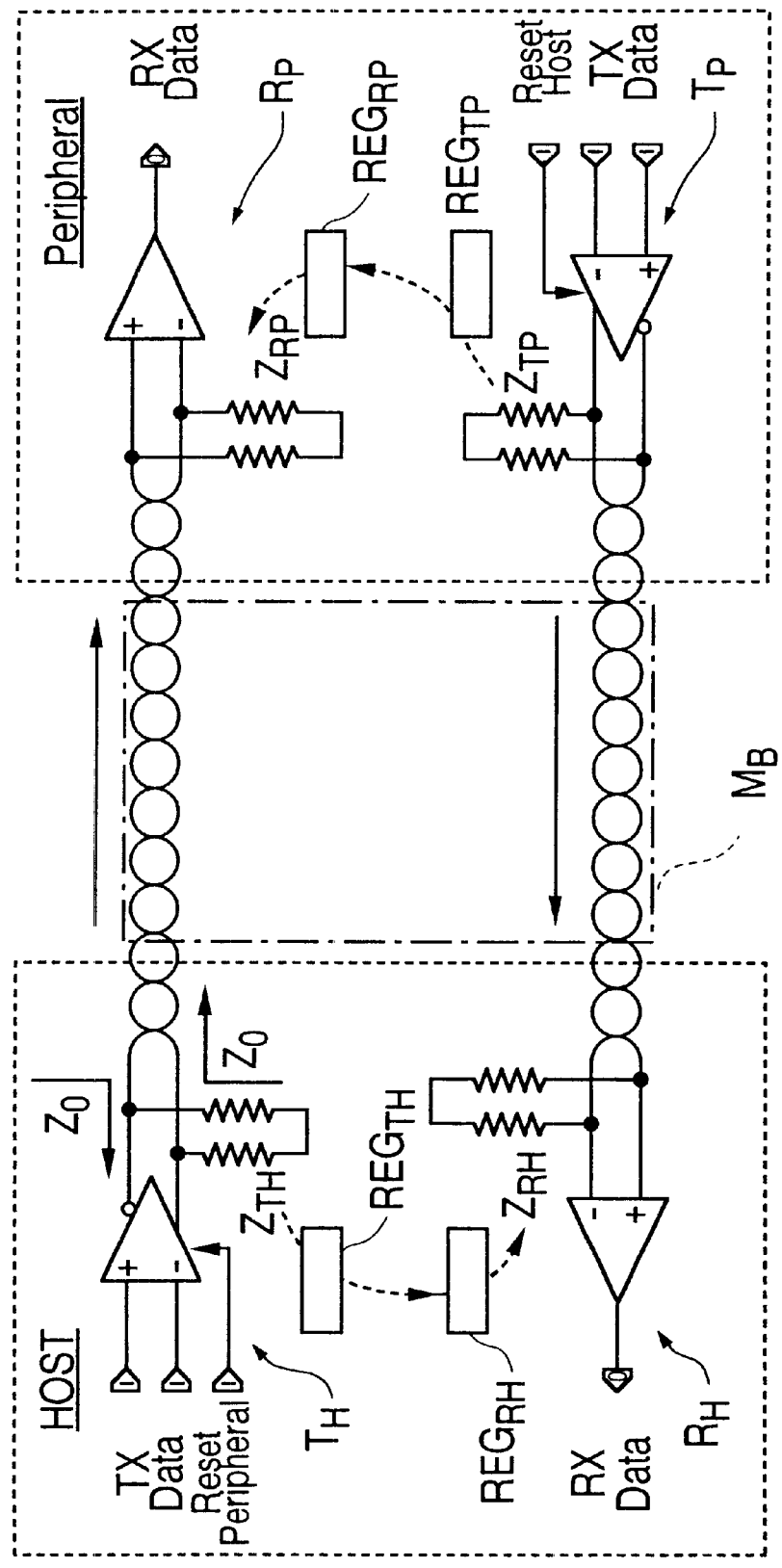
FIG. 4 is a block/schematic diagram of an example embodiment having an advantageous arrangement for calibrating host and peripheral devices to interfacing impedances in a full duplex communication system.

FIG. 4 is an example block/schematic diagram of an example embodiment having an advantageous arrangement for calibrating host and peripheral devices to interfacing impedances in a full duplex communication system. More particularly, for sake of brevity, only differences from the FIG. 2 disadvantageous embodiment will be discussed. As a first change, the transmission medium $M_B$ is provided as a bundled transmission medium meaning that the two transmission lines for the full duplex communication were manufactured under the same conditions or closely matched such that both transmission mediums (i.e., lines) have impedances (and possibly other characteristics) which closely match each other within a predetermined tolerance. An advantage of having such matched impedances will become apparent in the following discussions. As a second important change, the FIG. 4 advantageous embodiment simplifies impedance calibration by leveraging the consistency of high-volume manufacturing. More particularly, although from lot-to-lot the characteristic impedance of a transmitter, receiver, or cable may vary significantly, in contrast, within a lot, these impedances track very well. For example, in a semiconductor, if a device is determined to have a certain characteristic impedance, one can assume that an identical device on the same die will have the same characteristic impedance. Similarly, if each pair of signal wires in a serial ATA cable are manufactured simultaneously, the likelihood is high that they also will have similar characteristic impedances. Given this knowledge, a designer can calibrate the transmitter to an interfacing impedance of the transmission medium (i.e., cable) and then use a copy or the same setting or value of characteristic impedance from the calibrated device to calibrate the receiver load.

More specifically, FIG. 5 shows an example flow chart showing example operations with respect to the advantageous FIG. 4 example embodiment, i.e., for calibrating host and peripheral devices to interfacing impedances in the full duplex communication system. More particularly, within the flow 500, after start, at a block 502, there is a tuning or calibration of the host transmitter impedance $Z_{TH}$ to the interfacing impedance (i.e., in this case, to the characteristic impedance of the bundled transmission medium $M_B$). For example, one solution allowing selectable calibration of the transmitters characteristic impedance would use an array of triode-mode devices. During calibration (e.g., during system initialization) reflectometry methods and an iterative loop are used to determine how many of those devices should be enabled to achieve the ideal impedance match with the transmitter's differential signal pair. Such is a well-known technique and is not a focus of this disclosure.

Once the transmitters impedance is calibrated and set, a setting or value corresponding to such calibration/match can be stored, for example, within a register $REG_{TH}$ (FIG. 4). An identical second array of triode devices is used as the load (i.e., calibration impedance) for the receiver. The setting (e.g., number of devices) or value required to accomplish optimal match of the transmitter to the interfacing impedance is also applied (FIG. 5 block 504) to the receiver such that the receiver now has the same impedance as the transmitter. Since the transmitter and receiver were manufactured simultaneously together on-die and the characteristics of the same are similar, and since the bundled transmission medium $M_B$ match each other, the receiver now also matches its impedance $Z_{RH}$ to the interfacing impedance. That is, the value corresponding to the transmitter's calibrated impedance as stored within the register $REG_{TH}$ can be transferred to a similar receiver's register $REG_{RH}$ as indicated by the dashed arrowed line in FIG. 4. Subsequently the copied value is applied to effect the impedance calibration of the register.

Similar discussions can be made with respect to the peripheral side of the FIG. 4 embodiment. More particularly, in block 506, the peripheral transmitter impedance is tuned/calibrated to the interfacing impedance of $M_B$ and then the value of the calibrated peripheral transmitter impedance is applied (block 508) to also set the peripheral receiver impedance, e.g., again through use of the example registers $REG_{TP}$ and $REG_{RP}$, again as shown by the dashed arrowed line in FIG. 4 (peripheral block). While the example FIG. 5 flow 500 illustrates the host as calibrating its transmitter and then receiver first, followed by the peripheral's calibration of transmitter and then receiver, practice of the invention is not limited thereto, i.e., the peripheral could calibrate first.

As can be seen by the foregoing, the arrangement of the present invention is simple but powerful in that it helps enable the development of low-cost, high-volume and high-performance serial communications arrangements. More particularly, such arrangement adds no cost or loading to the receiver, and in fact, in all likelihood reduces cost and loading by the elimination of any extraneous transmitter associated with a receiver for calibration purposes. More particularly, the FIG. 4 arrangement has only one transmitter and one receiver on the host side, and only one transmitter and one receiver on the peripheral side.

As an additional benefit, the transmitter and receiver impedance calibration on either of the host or peripheral is lessened in time with respect to the FIG. 2 disadvantageous arrangement, in that only transmitter impedance tuning/calibration has to be effected and then simply applied to the receiver, as opposed to having to perform separate impedance calibrations for both the transmitter and receiver. Such impedance calibration can be effected under any of a plurality of times or instances. For example, impedance calibration may be made upon initialization of the system, can be made periodically based upon expiration of a timer, can be made at a time of a transmission medium (i.e., cable) change, can be made upon occurrence of a predetermined temperature as detected by a temperature sensor, can be made by system or user request, can be made responsive to detection of a change in operational voltage or average transmission frequency, etc.

In order to maximize the accuracy of having the transmitter calibration impedance and receiver calibration impedance be equally matchable to the bundled transmission medium, a number of additional precautions may also be desirable. More particularly, the transmitter and receiver on the host (or peripheral) should be arranged to be geographically close to one another as possible. That is, a small amount of processing variations may occur even in differing areas of a same die, and forming the transmitter and receiver geographically close to one another maximizes the likelihood that characteristics of the transmitter and receiver will exactly match one another. Further, such transmitter and receiver, in addition to being provided on a same die, should also be arranged to be exposed to the same environment. For example, with respect to same thermal effects, such transmitter and receiver should be equally close to any heat source such as a heat sink, and should be subjected to the same level of cooling air flow.

In addition to the above-described wire-interconnected environment, practice of the present invention is not limited to cables. For example, referencing FIG. 4, both the host and peripheral may be provided as a semiconductor IC mounted on a printed circuit board, whereas the transmission medium $M_B$ could be circuit board traces. Again, since the circuit board traces would likely be manufactured at a same time under same conditions, such traces would have corresponding characteristics (e.g., impedances). As another example, the FIG. 4 host and peripheral might be provided as different IC regions on a same die, whereas the transmission medium $M_B$ might be provided by doped semiconductor connection line or a deposited metallic wiring line (e.g., aluminum or copper). Again, common manufacturing would lead to substantially common characteristics. Accordingly, it can be seen that practice of the invention may be made from box-to-box, chip-to-chip, inside a box, on-die, etc.

In closing, reference in the specification to "one embodiment", "an embodiment", "example embodiment", etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

This concludes the description of the example embodiments. Although the present invention has been described with reference to a number of illustrative embodiments thereof, it should be understood that numerous other modifications and embodiments can be devised by those skilled in the art that will fall within the spirit and scope of the principles of this invention. More particularly, reasonable variations and modifications are possible in the component parts and/or arrangements of the subject combination arrangement within the scope of the foregoing disclosure, the drawings and the appended claims without departing from the spirit of the invention. In addition to variations and modifications in the component parts and/or arrangements, alternative uses will also be apparent to those skilled in the art.

More particularly, as mentioned previously, practice of the invention is not limited to the above-described, example cabled or wired environment, i.e., the invention may be internally within a boxed environment, providing receiver impedance calibration wherever needed. Further, practice of the present invention is not limited to duplex communications, but instead may also be applied in triplex, multiplex communications, and even in arrangements where there are many more (e.g., hundreds of) transmission paths interconnected therebetween a host and peripheral. Still further, practice of the present invention is not limited to matching a transmitter and receiver impedance to a transmission path impedance, i.e., practice of the present invention may be used to match impedances of any types of devices to any type of external impedances.

As another example variation, the above examples describe situation where devices (e.g., transmitters and receivers) and/or transmission mediums have substantially matched characteristics (e.g., impedances) and equal settings or values are transposed to impedance match other ones of the devices, but practice of the present invention is not limited thereto. For example, a host's receiver may be constructed/known to have characteristics which are some other proportionality (other than equal or 1) to the characteristics of the host's transmitter, e.g., to have twice the impedance of the host's transmitter. In such a situation, the known proportionality can be taken into account to transpose or interpolate an appropriate setting or value to the receiver for appropriate matching.

What is claimed is:

1. An impedance calibration arrangement comprising:
    a plurality of devices, the devices having predetermined characteristics substantially proportional to one another by a first predetermined factor;
    a plurality of interfacing arrangements, the interfacing arrangements having predetermined impedances substantially proportional to one another by a second predetermined factor; and
    an impedance matching arrangement to match an impedance of a device of said plurality of devices to an impedance of an interfacing arrangement of said plurality of interfacing arrangements, and to apply a predetermined proportional setting of such impedance matching to set a different impedance matching arrangement of at least another device of said plurality of devices to a corresponding interfacing arrangement of said plurality of interfacing arrangements.

2. An arrangement as claimed in claim 1, wherein said plurality of devices are at least one of transmitters and receivers, and wherein said plurality of interfacing arrangements are transmission mediums.

3. An arrangement as claimed in claim 1, wherein said plurality of devices have substantially matched characteristics, wherein said plurality of interfacing arrangements have substantially matched impedances, and wherein said impedance matching arrangement is arranged to apply an equal setting of said impedance matching.

4. An arrangement as claimed in claim 1, wherein said plurality of devices and said plurality of interfacing arrangements are part of a full multiplex communication system which is at least a full duplex communication system.

5. An arrangement as claimed in claim 1, wherein said plurality of devices are formed on a same die.

6. An arrangement as claimed in claim 1, wherein said plurality of interfacing arrangements are at least one of: resultant from a same manufacturing, and physically bundled together after being substantially impedance matched to one another.

7. A system comprising:
    an impedance calibration arrangement including;
    a plurality of devices, the devices having predetermined characteristics substantially proportional to one another by a first predetermined factor;
    a plurality of interfacing arrangements, the interfacing arrangements having predetermined impedances substantially proportional to one another by a second predetermined factor; and
    an impedance matching arrangement to match an impedance of a device of said plurality of devices to an impedance of an interfacing arrangement of said plurality of interfacing arrangements, and to apply a predetermined proportional setting of such impedance matching to set a different impedance matching arrangement of at least another device of said plurality of devices to a corresponding interfacing arrangement of said plurality of interfacing arrangements.

8. A system as claimed in claim 7, wherein said plurality of devices are at least one of transmitters and receivers, and wherein said plurality of interfacing arrangements are transmission mediums.

9. A system as claimed in claim 7, wherein said plurality of devices have substantially matched characteristics, wherein said plurality of interfacing arrangements have substantially matched impedances, and wherein said impedance matching arrangement is arranged to apply an equal setting of said impedance matching.

10. A system as claimed in claim 7, wherein said plurality of devices and said plurality of interfacing arrangements are part of a full multiplex communication system which is at least a full duplex communication system.

11. A system as claimed in claim 7, wherein said plurality of devices are formed on a same die.

12. A system as claimed in claim 7, wherein said plurality of interfacing arrangements are at least one of: resultant from a same manufacturing, and physically bundled together after being substantially impedance matched to one another.

13. An impedance calibration method comprising:
    providing a plurality of devices, the devices having predetermined characteristics substantially proportional to one another by a first predetermined factor;
    providing a plurality of interfacing arrangements, the interfacing arrangements having predetermined impedances substantially proportional to one another by a second predetermined factor; and
    providing an impedance matching arrangement to match an impedance of a device of said plurality of devices to an impedance of an interfacing arrangement of said plurality of interfacing arrangements, and to apply a predetermined proportional setting of such impedance matching to set a different impedance matching arrangement of at least another device of said plurality of devices to a corresponding interfacing arrangement of said plurality of interfacing arrangements.

14. A method as claimed in claim 13, wherein said plurality of devices are at least one of transmitters and receivers, and wherein said plurality of interfacing arrangements are transmission mediums.

15. A method as claimed in claim 13, wherein said plurality of devices have substantially matched characteristics, wherein said plurality of interfacing arrangements have substantially matched impedances, and wherein said impedance matching arrangement applies an equal setting of said impedance matching.

16. A method as claimed in claim 13, wherein said plurality of devices and said plurality of interfacing arrangements are part of a full multiplex communication system which is at least a full duplex communication system.

17. A method as claimed in claim 13, wherein said plurality of devices are formed on a same die.

18. A method as claimed in claim 13, wherein said plurality of interfacing arrangements are at least one of: resultant from a same manufacturing, and physically bundled together after being substantially impedance matched to one another.

* * * * *